(12) United States Patent
Chen et al.

(10) Patent No.: US 12,549,159 B2
(45) Date of Patent: Feb. 10, 2026

(54) INJECTION LOCKED PHASE ROTATOR

(71) Applicant: Xilinx, Inc., San Jose, CA (US)

(72) Inventors: Li Yang Chen, San Jose, CA (US); Chi Fung Poon, San Jose, CA (US); Chuenhuei Chou, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/440,450

(22) Filed: Feb. 13, 2024

(65) Prior Publication Data

US 2025/0260393 A1 Aug. 14, 2025

(51) Int. Cl.
| | |
|---|---|
| *H03B 27/00* | (2006.01) |
| *H03K 3/03* | (2006.01) |
| *H03K 3/354* | (2006.01) |
| *H03L 7/099* | (2006.01) |
| *H03L 7/24* | (2006.01) |

(52) U.S. Cl.
CPC ......... *H03K 3/0322* (2013.01); *H03B 27/00* (2013.01); *H03K 3/354* (2013.01); *H03L 7/0995* (2013.01); *H03L 7/24* (2013.01)

(58) Field of Classification Search
CPC .... H03B 27/00; H03K 3/0315; H03K 3/0322; H03L 7/0995; H03L 7/24
USPC ........................................................ 331/57
See application file for complete search history.

(56) References Cited

U.S. PATENT DOCUMENTS

| | | | |
|---|---|---|---|
| 9,444,435 B1 * | 9/2016 | Monaco | H03K 3/0322 |
| 10,237,052 B1 * | 3/2019 | Moscone | H03L 7/081 |
| 10,536,151 B1 * | 1/2020 | Zhou | G06F 1/06 |
| 11,405,043 B1 * | 8/2022 | Grave | H03K 5/15046 |
| 11,728,962 B2 * | 8/2023 | Ma | H03K 19/21 |
| | | | 375/354 |
| 2012/0062293 A1 * | 3/2012 | Liang | H03L 7/23 |
| | | | 327/156 |
| 2012/0224407 A1 * | 9/2012 | Aleksic | H03L 7/081 |
| | | | 331/34 |
| 2019/0363674 A1 * | 11/2019 | Pandita | H04L 27/16 |
| 2021/0313992 A1 * | 10/2021 | Parvizi | H03L 7/099 |
| 2025/0080089 A1 * | 3/2025 | Grave | H03L 7/0995 |

* cited by examiner

*Primary Examiner* — Levi Gannon
(74) *Attorney, Agent, or Firm* — Slater Matsil, LLP

(57) ABSTRACT

An injection locked ring oscillator (ILRO) system is disclosed. The ILRO system includes an ILRO circuit configured to receive a plurality of injection control signals and a phase control signal, and to generate a plurality of output clock signals; a phase detector circuit configured to receive the output clock signals and to generate a phase output signal based on phase differences of particular pairs of the output clock signals; and a phase to voltage circuit configured to receive the phase output signal from the phase detector circuit, and to generate the phase control signal based on the phase output signal, where the phase control signal presents a negative feedback phase signal to the ILRO circuit for the phase differences in the particular pairs of the output clock signals.

20 Claims, 5 Drawing Sheets

INJECTION LOCKED PHASE ROTATOR

BACKGROUND

Conventional phase rotator circuits typically employ voltage-controlled oscillators (VCOs) or digital phase shifters, which often suffer from power consumption, speed, and precision issues. Injection-locked phase rotator circuits offer an innovative alternative by leveraging injection locking, where an external signal synchronizes the phase and frequency of an oscillator, enabling rapid and precise phase adjustments without VCOs' power consumption or digital phase shifters' complexity. These circuits are gaining attention for their potential to provide low-power, high-speed, and accurate phase control.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
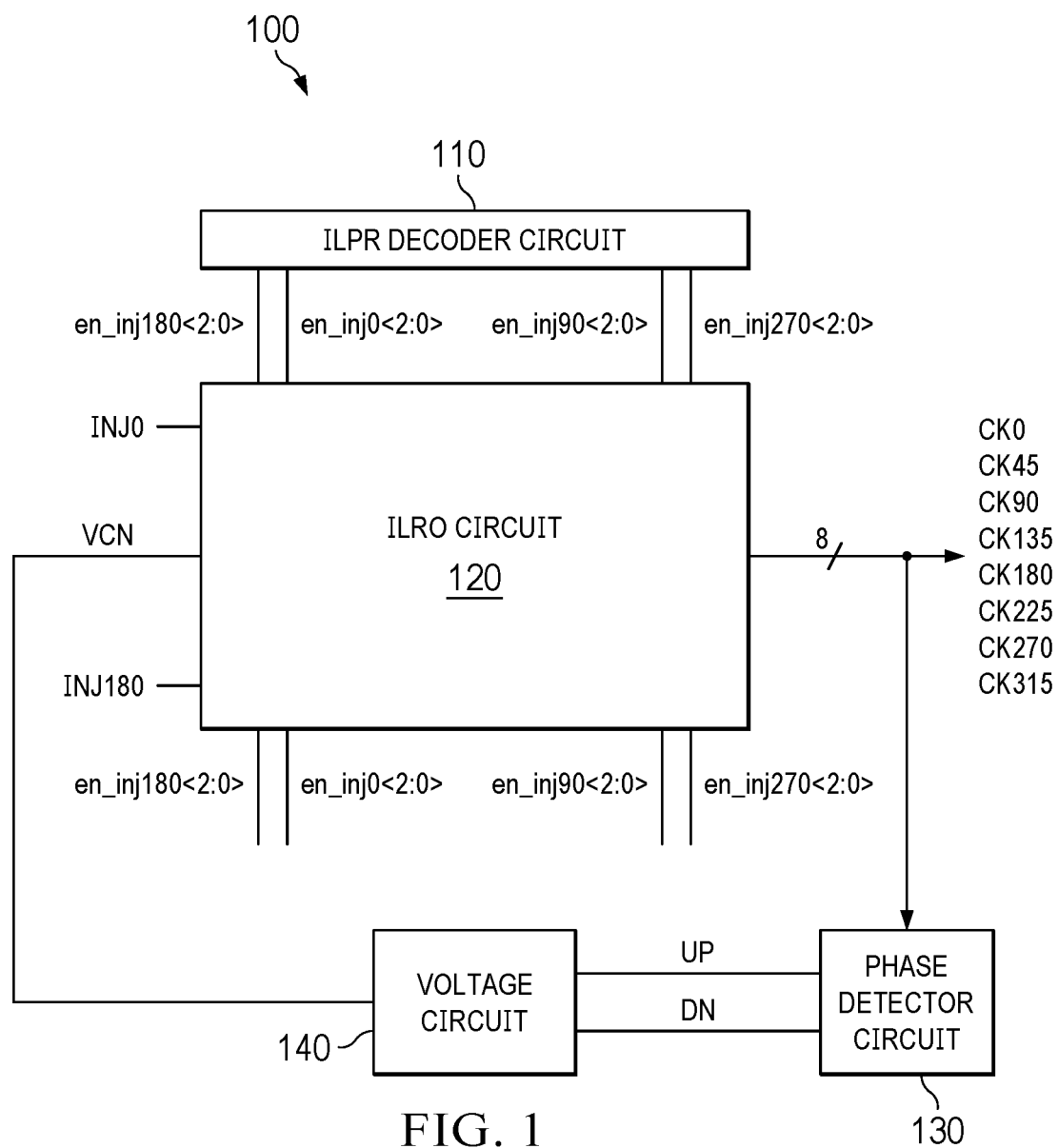
FIG. 1 illustrates an injection locked phase rotator (ILPR) circuit according to some implementations.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope. Throughout the discussion herein, unless otherwise specified, the same or similar reference numerals or labels in different figures refer to the same or similar component or signal.

Reference to "an implementation," "one implementation," "an embodiment," or "one embodiment" in the framework of the present description is intended to indicate that a particular configuration, structure, or characteristic described in relation to the implementation/embodiment is included in at least one implementation/embodiment. Hence, phrases such as "in one implementation" or "in one embodiment" that may be present in one or more points of the present description do not necessarily refer to one and the same implementation/embodiment. Moreover, particular conformations, structures, or characteristics may be combined in any adequate way in one or more implementations/embodiments. The references used herein are provided merely for convenience and hence do not define the extent of protection or the scope of the implementations/embodiments.

Injection locked phase rotator circuits with a free-running injection-locked ring oscillator (ILRO) is a common way to implement injection locked phase rotator (ILPR) circuits. However, the ILPR circuits are sensitive to power, voltage, and temperature variation because there is no closed-loop frequency tracking over the power, voltage, and temperature variation. Some ILPR circuits have closed-loop feedback using a digital assist engine to close the loop. However, this approach increases the complexity of the design.

The implementations discussed herein use an injection locked ring oscillator (ILRO) circuit having oscillator delay elements which have delays which are affected by a control voltage input. The control voltage input is generated based on phase differences in the output clocks in a feedback loop which optimizes the phase differences in the output clocks. In some implementations, the phase differences of output clocks separated by an of less than 90, 80, 70, 60, and 50 degrees are used. In some implementations, the phase differences of output clocks separated by 45 degrees, 22.5 degrees, 11.25 degrees, or another amount are used. In the example implementations discussed herein, the phase differences of output clocks separated by 45 degrees are used. Unless specified otherwise, the values of phase differences and phase angles disclosed herein are not limited to the exact value given and include some variation for component tolerances (e.g., phase difference of 45 degrees (within component tolerances)).

Accordingly, the implementations discussed herein provide analog-based techniques for maintaining high performance for frequency and phase control across power, voltage, and temperature variations.

FIG. 1 illustrates an injection locked phase rotator (ILPR) circuit 100 according to some implementations. ILPR circuit 100 generates eight output clock signals CK0, CK45, CK90, CK135, CK180, CK225, CK270, and CK315, which are separated by 45 degrees in phase. In the illustrated implementation, ILPR circuit 100 includes ILPR decoder circuit 110, ILRO circuit 120, phase detector circuit 130, and phase to voltage circuit 140.

ILPR decoder circuit 110 is configured to receive control signals and to generate injection control signals en_inj0<2:0>, en_inj90<2:0>, en_inj180<2:0>, and en_inj270<2:0> based on the control signals. The injection control signals en_inj0<2:0>, en_inj90<2:0>, en_inj180<2:0>, and en_inj270<2:0> are sequentially active, one at a time, in a repeating pattern. The active period of injection signal en_inj0<2:0> sequentially follows the active period of injection signal en_inj270<2:0>. The active period of injection signal en_inj90<2:0> sequentially follows the active period of injection signal en_inj0<2:0>. The active period of injection signal en_inj180<2:0> sequentially follows the active period of injection signal en_inj90<2:0>. The active period of injection signal en_inj270<2:0> sequentially follows the active period of injection signal en_inj180<2:0.

ILRO circuit 120 is configured to receive the injection control signals en_inj0<2:0>, en_inj90<2:0>, en_inj180<2:0>, and en_inj270<2:0> from ILPR decoder circuit 110, is configured to receive injection clocks INJ0 and INJ180, and is configured to receive a phase control signal vcn. In addition, ILRO circuit 120 is configured to generate output clock signals CK0, CK45, CK90, CK135, CK180, CK225, CK270, and CK315 based on the injection control signals from ILPR decoder circuit 110, injection clocks INJ0 and INJ180, and phase control signal vcn.

The injection clocks INJ0 and INJ180 are 180 degrees out of phase and define the frequency of the output clock signals CK0, CK45, CK90, CK135, CK180, CK225, CK270, and CK315. The injection control signals en_injo<2:0>, en_inj90<2:0>, en_inj180<2:0>, and en_inj270<2:0> define a magnitude or strength of the current injections which occur in response to the injection clocks INJ0 and INJ180. The data defining the magnitude or strength of each of the injection control signals en_injo<2:0>, en_inj90<2:0>, en_inj180<2:0>, and en_inj270<2:0> is determined by a controller or processor or circuit. For example, a controller (or processor or circuit) can receive or process data that determines the magnitude or strength of each of the injection control signals. The controller can dynamically adjust the magnitude or strength of the control signals, based on predefined patterns, real-time feedback, external inputs (like sensors or user inputs), or the like, to control the current injections.

ILRO circuit 120 includes a number of delay elements having a circuit driving capacity which is influenced or determined by phase control signal von, which is generated by phase to voltage circuit 140 in response to the phase output signal generated by phase detector circuit 130.

Phase detector circuit 130 receives output clock signals CK0, CK45, CK90, CK135, CK180, CK225, CK270, and CK315 from ILRO circuit 120. In addition, phase detector circuit 130 generates a differential phase output signal for phase to voltage circuit 140 based on phase differences of pairs of output clock signals CK0, CK45, CK90, CK135, CK180, CK225, CK270, and CK315.

Phase to voltage circuit 140 receives the differential phase output signal from phase detector circuit 130, and generates the phase control signal von based on the differential phase output signal.

In some implementations, phase differences between any of output clock signals CK45 and CK90, output clock signals CK135 and CK180, output clock signals CK225 and CK270, and output clock signals CK315 and CK0, cause the phase detector circuit 130 and the phase to voltage circuit 140 to cooperatively modify the phase control signal von such that the delay elements of ILRO circuit 120 have increased driving capacity. In some implementations, phase differences between any of output clock signals CK0 and CK45, output clock signals CK90 and CK135, output clock signals CK180 and CK225, and output clock signals CK270 and CK315, cause the phase detector circuit 130 and the phase to voltage circuit 140 to cooperatively modify the phase control signal von such that the delay elements of ILRO circuit 120 to have decreased driving capacity.

The combined effect of each of the listed pairs of output clock signals are represented in the phase control signal vcn such that the phase control signal vcn presents a negative feedback phase signal for both phase differences greater than 45 degrees and for phase differences less than 45 degrees. Therefore, phase differences greater than 45 degrees cause the delay elements to decrease their delay, and to, accordingly, reduce phase differences. Similarly, phase differences less than 45 degrees cause the delay elements to increase their delay, and to, accordingly increase phase differences. Therefore, after the loop settles, the phase differences are optimized to be equal to 45 degrees within component tolerances.

Figure 2:
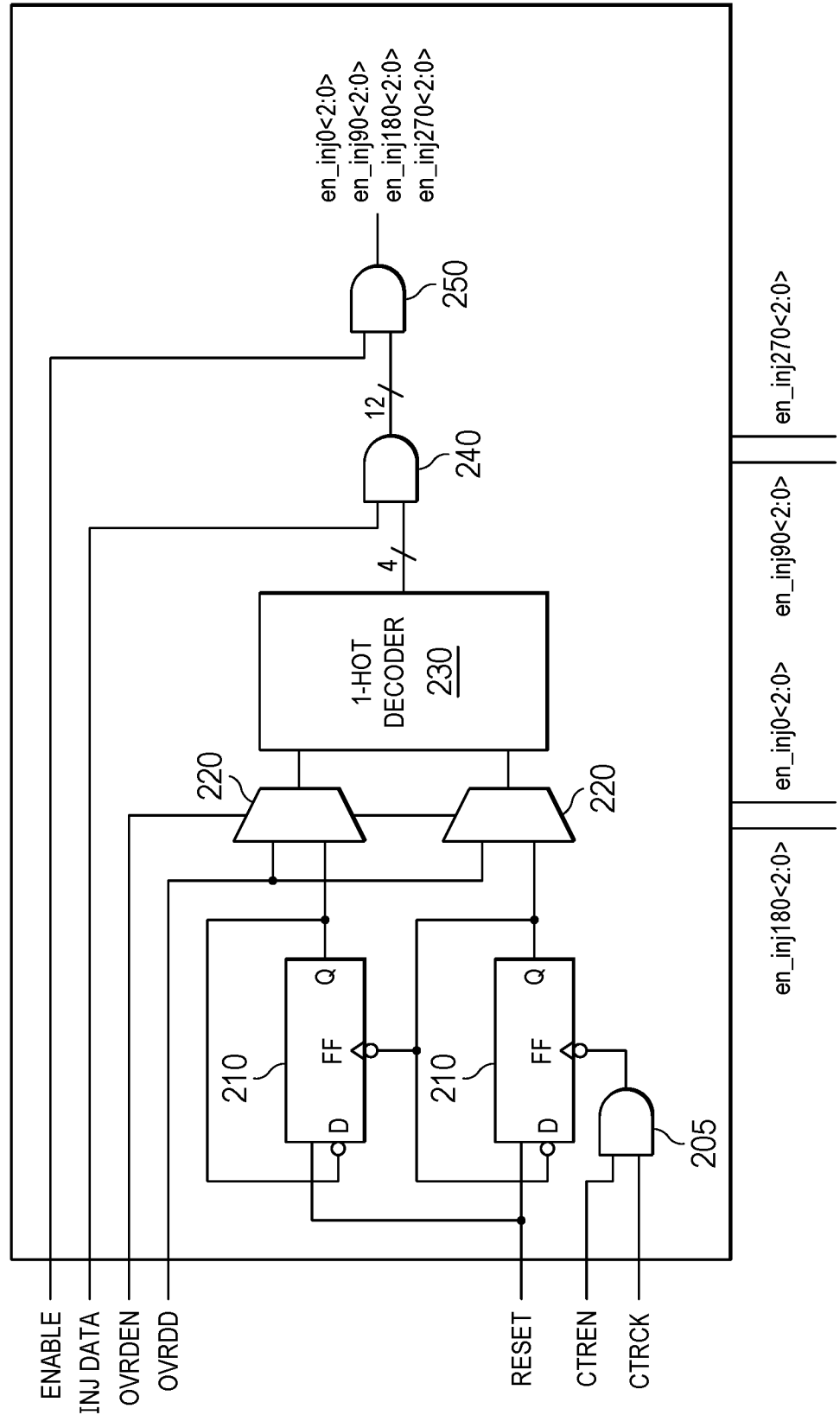
FIG. 2 illustrates an ILPR decoder circuit according to some implementations.

FIG. 2 illustrates an ILPR decoder circuit 200 according to some implementations. ILPR decoder circuit 200 may be used as ILPR decoder circuit 110 of FIG. 1. ILPR decoder circuit 200 is configured to receive control signals and to generate injection control signals en_injo<2:0>, en_inj90<2:0>, en_inj180<2:0>, and en_inj270<2:0> based on the control signals.

For example, in this implementation, ILPR decoder circuit 200 is configured to receive an enable signal ENABLE, an injection data signal INJ DATA, a phase override enable signal OVRDEN, and an override data signal OVRDD. In addition, in the illustrated implementation, ILPR decoder circuit 200 is configured to receive a reset signal RESET, a counter enable signal CTREN, and a counter clock signal CTRCK. ILPR decoder circuit 200 comprises an AND gate 205, two bit counter 210, multiplexers 220, a one hot decoder 230, AND gate array 240, and AND gate array 250.

Two bit counter 210 includes two flip-flops which provide a count signal to multiplexers 220. The two bit counter 210 is clocked by counter clock signal CTRCK conditioned by counter enable signal CTREN by AND gate 205. The two bit counter 210 is reset, for example, to 00 in response to the reset signal RESET being active. In response to the reset signal RESET being inactive and, for example, to rising edges of the counter clock signal CTRCK, the two bit counter 210 counts.

Multiplexers 220 receive the count from the two bit counter as first input data, and receive override data signal OVRDD as second input data. Multiplexers 220 pass either the first input data or the second input data to one hot decoder 230, according to the logic state of the phase override enable signal OVRDEN.

One hot decoder 230 receives the two bit output of multiplexers 220, and decodes the two bits to generate a four bit output, where one of the four output bits is active, and where which of the four bits is active corresponds with the received two bit output of multiplexers 220. For example, if the two bit output of multiplexers 220 are 00, 01, 10, and 11, the respective outputs of one hot decoder 230 may be 0001, 0010, 0100, and 1000.

AND gate array 240 comprises 12 AND gates organized as four sets of three two bit AND gates. The AND gates of each of the four sets receives a corresponding one of the four output bits of the one hot decoder 230. In addition, the AND gates of each of the four sets receives one of the three bits of the injection data signal INJ DATA.

Accordingly, AND gate array 240 generates 12 output bits logically organized as four sets of three output bits. One of the four sets of three output bits is equal to the three bits of the injection data signal INJ DATA, and the other three of the four sets of three output bits is equal to 0. Which one of the four sets of three output bits is equal to the three bits of the injection data signal INJ DATA is determined by the one hot decoder 230 based on the count received from the two bit counter.

AND gate array 250 includes 12 two bit AND gates, each receiving an output of one of the AND gates of AND gate array 240. Each of the 12 two bit AND gates of AND gate array 250 also receives the enable signal ENABLE. Accordingly, AND gate array 250 generates 12 output bits, and when the enable signal ENABLE is active, one of the four sets of three output bits is equal to the three bits of the injection data signal INJ DATA, and the other three of the four sets of three output bits is equal to 0. Which one of the four sets of three output bits is equal to the three bits of the injection data signal INJ DATA is determined by the one hot decoder 230 based on the count received from the two bit counter. When the enable signal ENABLE is inactive, all 12 bits of the output of AND gate array 250 are 0.

Figure 3:
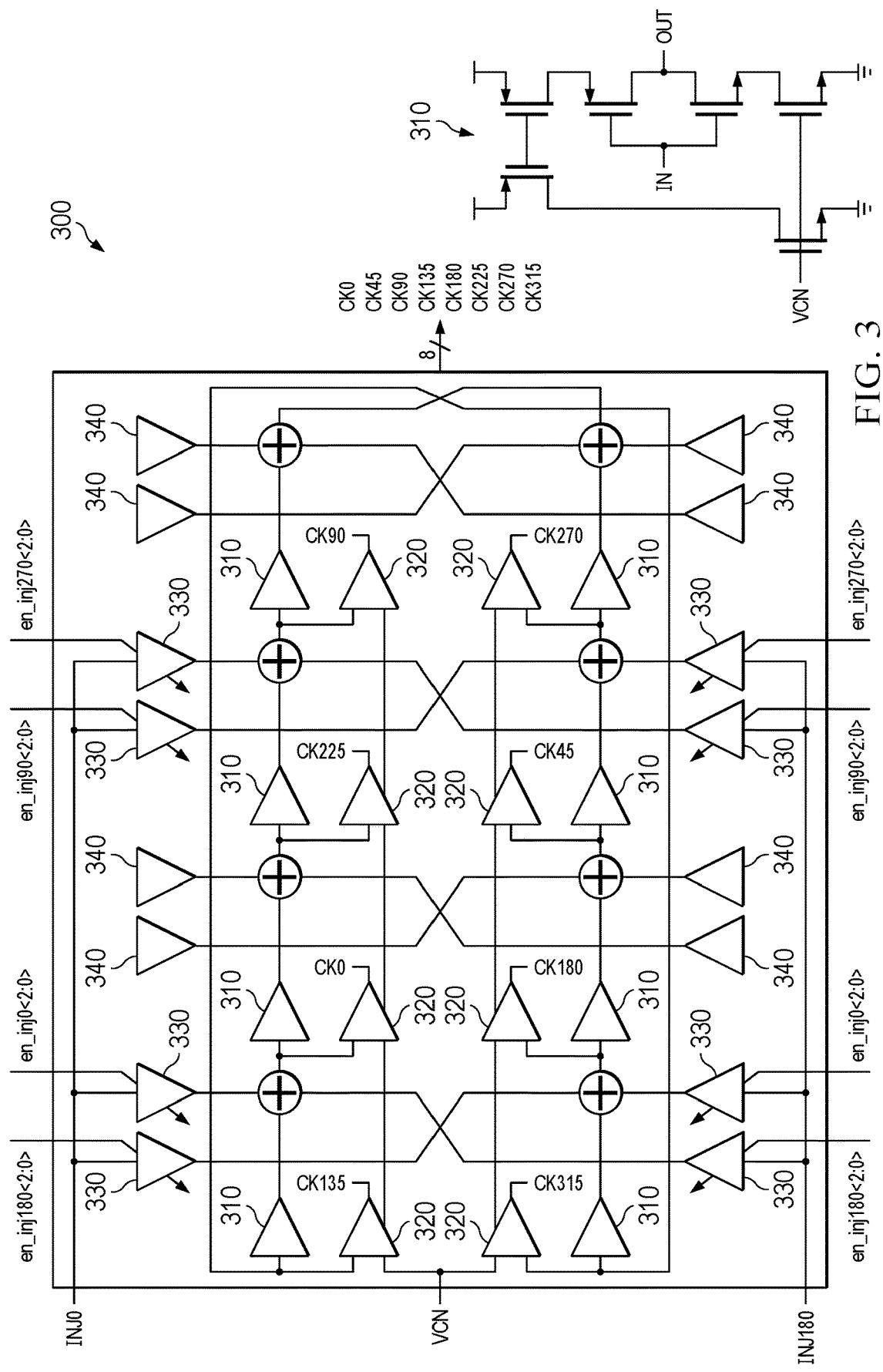
FIG. 3 illustrates a portion of an injection locked ring oscillator (ILRO) circuit according to some implementations.

FIG. 3 illustrates a portion of an injection locked ring oscillator (ILRO) circuit 300 according to some implementations. ILRO circuit 300 may be used as ILRO circuit 120 of FIG. 1. ILRO circuit 300 includes delay elements 310, clock buffers 320, injection drivers 330, and dummy injection drivers 340.

ILRO circuit 300 is configured to receive injection control signals en_inj0<2:0>, en_inj90<2:0>, en_inj180<2:0>, and en_inj270<2:0> from an ILPR decoder circuit, such as ILPR decoder circuit 200. In addition, ILRO circuit 300 is configured to receive injection clocks INJ0 and INJ180, and is configured to receive a phase control signal vcn. Furthermore, ILRO circuit 300 is configured to generate output clock signals CK0, CK45, CK90, CK135, CK180, CK225, CK270, and CK315 based on the injection control signals from ILPR decoder circuit 110, injection clocks INJ0 and INJ180, and phase control signal vcn.

Delay elements 310 and injection drivers 330 form an injection locked ring oscillator circuit, which operates based on delay times of the delay elements 310 and based on injection signals from injection drivers 330. The injection signals are generated based on injection control signals en_inj0<2:0>, en_inj90<2:0>, en_inj180<2:0>, and en_inj270<2:0>. The delay times of the delay elements 310 are influenced by the phase control signal ven. For example, a detailed implementation of a delay element 310 is shown and illustrates an example of the effect of phase control signal vcn.

The injection clocks INJ0 and INJ180 are 180 degrees out of phase and define the frequency of the output clock signals CK0, CK45, CK90, CK135, CK180, CK225, CK270, and CK315. The injection clocks INJ0 and INJ180 are aligned with the injection control signals en_inj0<2:0>, en_inj90<2:0>, en_inj180<2:0>, and en_inj270<2:0>, such that the injection control signals en_inj0<2:0>, en_inj90<2:0>, en_inj180<2:0>, and en_inj270<2:0> define a magnitude or strength of the current injections which occur in response to the injection clocks INJ0 and INJ180.

Dummy injection drivers 340 have structure similar or identical to injection drivers 330, but do not function to generate injection signals. However dummy injection drivers 340 present loads which are similar or identical to injection drivers 330.

Figure 4:
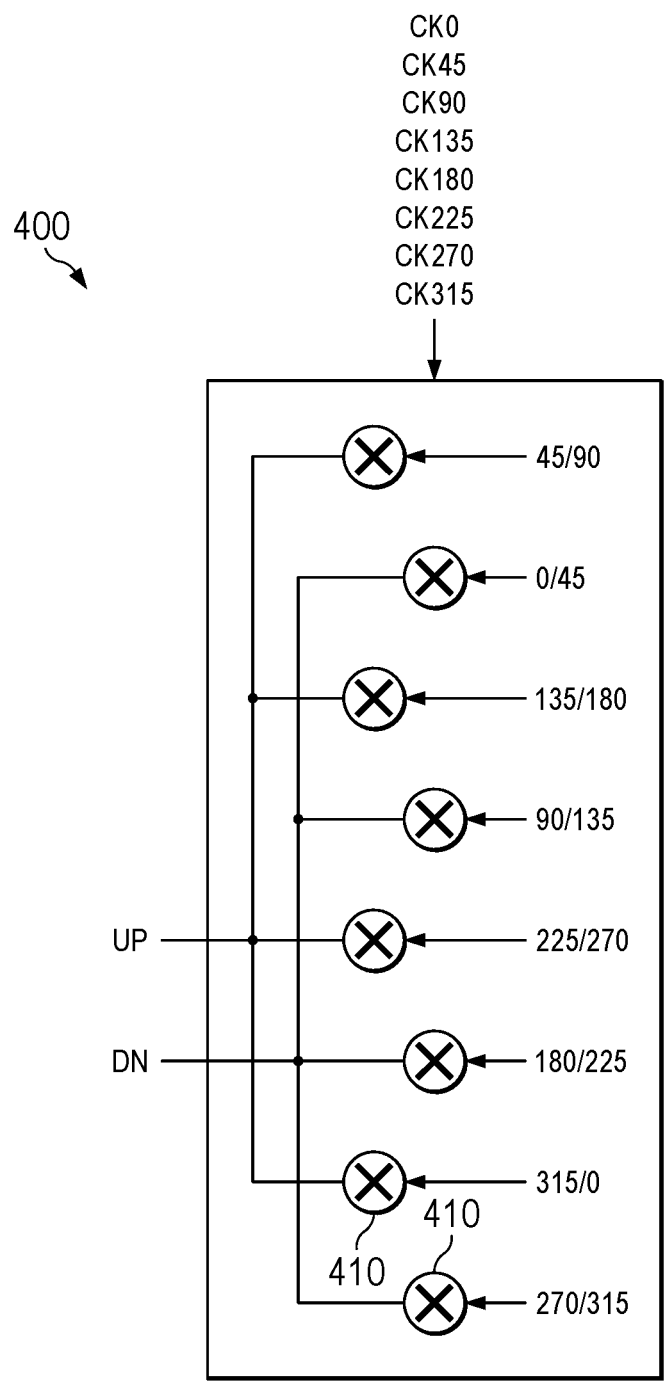
FIG. 4 illustrates a phase detector circuit according to some implementations.

FIG. 4 illustrates a phase detector circuit 400 according to some implementations. Phase detector circuit 400 may be used, for example, as phase detector circuit 130 of FIG. 1. In this implementation, phase detector circuit 400 includes eight mixers 410.

Phase detector circuit 400 receives output clock signals CK0, CK45, CK90, CK135, CK180, CK225, CK270, and CK315 and generates a differential phase output signal (up-dn) based on phase differences of pairs of the output clock signals CK0, CK45, CK90, CK135, CK180, CK225, CK270, and CK315.

In the illustrated implementation, phase differences between any of output clock signals CK45 and CK90, output clock signals CK135 and CK180, output clock signals CK225 and CK270, and output clock signals CK315 and CK0, cause the phase detector circuit 400 to increase the differential phase output signal. In the illustrated implementation, phase differences between any of output clock signals CK0 and CK45, output clock signals CK90 and CK135, output clock signals CK180 and CK225, and output clock signals CK270 and CK315, cause the phase detector circuit 400 to decrease the differential phase output signal.

Figure 5:
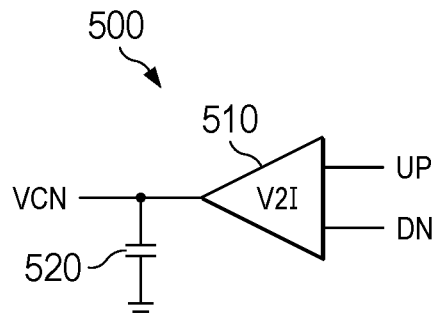
FIG. 5 illustrates a phase to voltage circuit according to some implementations.

FIG. 5 illustrates a phase to voltage circuit 500 according to some implementations. Phase to voltage circuit 500 may be used, for example, as phase to voltage circuit 140 of FIG. 1. Phase to voltage circuit 500 includes voltage to current circuit 510, and capacitor 520. Phase to voltage circuit 500 is configured to receive a differential phase output signal, and to generate a phase control signal vcn based on the differential phase output signal.

Voltage to current circuit 510 may be any voltage to current circuit known in the art. For example, voltage to current circuit 510 may be configured to generate a current substantially equal to a constant times a difference between the up and dn input signals. Accordingly, in response to the up signal being greater than the dn signal, the output current from the voltage to current circuit 510 is greater than 0, and, in response to the up signal being less than the dn signal, the output current from the voltage to current circuit 510 is less than 0.

The voltage of capacitor 520 (equal to the phase control signal vcn), represents an integration of the current output of the voltage to current circuit 510. Accordingly, in response to the up signal being greater than the dn signal, the output current from the voltage to current circuit 510 is greater than 0 and the phase control signal vcn increases, and, in response to the up signal being less than the dn signal, the output current from the voltage to current circuit 510 is less than 0 and the phase control signal vcn decreases.

Figure 6:
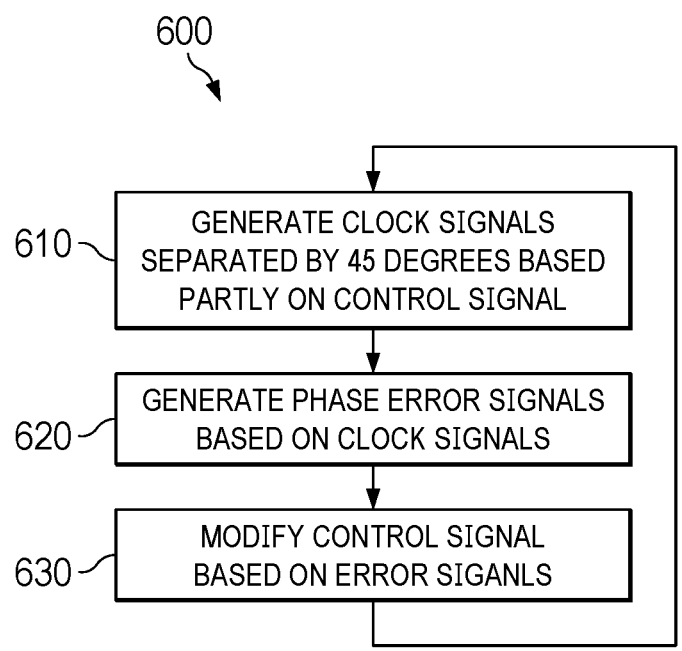
FIG. 6 illustrates a method of operating and ILPR circuit according to some implementations.

FIG. 6 illustrates a method 600 of operating an ILPR circuit according to some implementations. For example, ILPR circuit 100 may operate according to method 600.

At block 610, the ILPR circuit generates eight output clock signals separated by 45 degrees. For example, the ILPR circuit may generate eight output clock signals, such as CK0, CK45, CK90, CK135, CK180, CK225, CK270, and CK315 generated by ILPR circuit 100. The eight output clock signals may be generated based on injection signals, and based on a control signal, where the control signal influences a delay of a plurality of delay elements of an ILRO circuit of the ILPR circuit.

At block 620, a phase error signal may be generated based on the eight output clock signals. For example, a differential phase signal may be generated based on particular pairs of the output clocks. For example, phase differences between any of output clock signals CK45 and CK90, output clock signals CK135 and CK180, output clock signals CK225 and CK270, and output clock signals CK315 and CK0, may cause the differential phase signal to increase, and phase differences between any of output clock signals CK0 and CK45, output clock signals CK90 and CK135, output clock signals CK180 and CK225, and output clock signals CK270 and CK315, may cause the differential phase signal to decrease.

At block 630, the control signal used at block 610 to generate the eight output clock signals is adjusted based on the phase error signal generated at block 620. For example, in response to the differential phase signal increasing, the control signal may be increased, and, in response to the differential phase signal decreasing, the control signal may be decreased.

The combined effect of each of the listed pairs of output clock signals are represented in the phase control signal vcn such that the phase control signal vcn presents a negative feedback phase signal for both phase differences greater than 45 degrees and for phase differences less than 45 degrees. By injecting the ILRO circuit at 90 degrees phase separation, and using 45 degree as the reference plane for the phase error detection, the phase detector output can maintain the same polarity at all times while rotating the phase. The phase error is consistent when the phase control signal vcn rotates the injection phase, and the polarity at the phase detector output doesn't vary with the injection phase. Accordingly, phase differences greater than 45 degrees cause the delay elements to decrease their delay, and to, accordingly, reduce the phase differences. Similarly, phase differences less than 45 degrees cause the delay elements to increase their delay, and to, accordingly increase the phase differences. Therefore, after the loop settles, the phase differences are optimized to be equal to 45 degrees within component tolerances.

One general aspect is an injection locked ring oscillator (ILRO) system, including an ILRO circuit configured to receive a plurality of injection control signals and a phase control signal, and to generate a plurality of output clock signals; a phase detector circuit configured to receive the output clock signals and to generate a phase output signal based on phase differences of particular pairs of the output clock signals; and a phase to voltage circuit configured to receive the phase output signal from the phase detector circuit, and to generate the phase control signal based on the phase output signal, where the phase control signal presents a negative feedback phase signal to the ILRO circuit for the phase differences in the particular pairs of the output clock signals.

Implementations may include one or more of the following features. The ILRO system, where the phase control signal presents the negative feedback phase signal to the ILRO circuit both for phase differences greater than 45 degrees in the particular pairs of the output clock signals and for phase differences less than 45 degrees in the particular pairs of the output clock signals. The ILRO system, where the output clock signals include eight output clock signals, where a first output clock has an about 0 degree phase, a second clock has an about 45 degree phase, a third clock has an about 90 degree phase, a fourth clock has an about 135 degree phase, a fifth clock has an about 180 degree phase, a six clock has an about 225 degree phase, a seventh clock has an about 270 degree phase, and an eighth clock has an about 315 degree phase, where the phase control signal is generated based on phase differences of the first and second clocks, the second and third clocks, the third and fourth clocks, the fourth and fifth clocks, the fifth and sixth clocks, the sixth and seventh clocks, the seventh and eighth clocks, and the eighth and first clocks. The ILRO system, where the ILRO circuit includes a plurality of delay components, and where the phase differences of the first and second clocks, the third and fourth clocks, the fifth and sixth clocks, and the seventh and eighth clocks cause the phase control signal to increase a delay of the delay components. The ILRO system, where the ILRO circuit includes a plurality of delay elements, and where the phase differences of the second and third clocks, the fourth and fifth clocks, the sixth and seventh clocks, and the eighth and first clocks cause the phase control signal to decrease a delay of the delay components. The ILRO system, where the ILRO circuit includes a plurality of delay components, and where changes in the phase differences of the first and second clocks, the third and fourth clocks, the fifth and sixth clocks, and the seventh and eighth clocks change a current, where the change in the current causes the phase control signal to decrease a delay of the delay components. The ILRO system, where the ILRO circuit includes a plurality of delay components, and where changes in the phase differences of the second and third clocks, the fourth and fifth clocks, the sixth and seventh clocks, and the eighth and first clocks change a current, where the change in the current causes the phase control signal to increase a delay of the delay components.

Another general aspect is an injection locked phase rotator (ILPR) circuit, including an ILPR decoder circuit configured to generate a plurality of injection control signals; an injection locked ring oscillator (ILRO) circuit configured to receive the injection control signals and a phase control signal, and configured to generate a plurality of output clock signals; a phase detector circuit configured to receive the output clock signals and to generate a phase output signal based on phase differences of particular pairs of the output clock signals separated by 45 degrees or less; and a phase to voltage circuit configured to receive the phase output signal, and to generate the phase control signal based on the phase output signal.

Implementations may include one or more of the following features. The ILPR circuit, where the phase control signal presents a negative feedback phase signal to the ILRO circuit both for phase differences greater than 45 degrees in the particular pairs of the output clock signals and for phase differences less than 45 degrees in the particular pairs of the output clock signals. The ILPR circuit, where the output clock signals include eight output clock signals, where a first output clock has an about 0 degree phase, a second clock has an about 45 degree phase, a third clock has an about 90 degree phase, a fourth clock has an about 135 degree phase, a fifth clock has an about 180 degree phase, a six clock has an about 225 degree phase, a seventh clock has an about 270 degree phase, and an eighth clock has an about 315 degree phase, where the phase control signal is generated based on phase differences of the first and second clocks, the second and third clocks, the third and fourth clocks, the fourth and fifth clocks, the fifth and sixth clocks, the sixth and seventh clocks, the seventh and eighth clocks, and the eighth and first clocks. The ILPR circuit, where the ILRO circuit includes a plurality of delay components, and where the phase differences of the first and second clocks, the third and fourth clocks, the fifth and sixth clocks, and the seventh and eighth clocks cause the phase control signal to increase a delay of the delay components. The ILPR circuit, where the ILRO circuit includes a plurality of delay components, and where the phase differences of the second and third clocks, the fourth and fifth clocks, the sixth and seventh clocks, and the eighth and first clocks cause the phase control signal to decrease a delay of the delay components. The ILPR circuit, where the ILRO circuit includes a plurality of delay components, and where changes in the phase differences of the first and second clocks, the third and fourth clocks, the fifth and sixth clocks, and the seventh and eighth clocks change a current, where the change in the current causes the phase control signal to decrease a delay of the delay components. The ILPR circuit, where the ILRO circuit includes a plurality of delay components, and where changes in the phase differences of the second and third clocks, the fourth and fifth clocks, the sixth and seventh clocks, and the eighth and first clocks change a current, where the change in the current causes the phase control signal to increase a delay of the delay components.

Another general aspect is a method of operating an injection locked phase rotator (ILPR) circuit, the method including, with an ILPR decoder circuit, generating a plurality of injection control signals; with an injection locked ring oscillator (ILRO) circuit, receiving the injection control signals from the ILPR decoder circuit; with the ILRO circuit, receiving injection clocks; with the ILRO circuit, receiving a phase control signal; with the ILRO circuit, generating a plurality of output clock signals based on the injection control signals, the injection clocks, and the phase control signal; with a phase detector circuit, receiving the output clock signals; with the phase detector circuit, generating a phase output signal based on phase differences of particular pairs of the output clock signals, where the particular pairs of the output clock signals are separated by 45 degrees or less; with a phase to voltage circuit, receiving the phase output signal from the phase detector circuit; and with the phase to voltage circuit, generating the phase control signal based on the phase output signal.

Implementations may include one or more of the following features. The method, where the phase control signal presents a negative feedback phase signal to the ILRO circuit both for phase differences greater than 45 degrees in the particular pairs of the output clock signals and for phase differences less than 45 degrees in the particular pairs of the output clock signals. The method, where the output clock signals include eight output clock signals, where a first output clock has an about 0 degree phase, a second clock has an about 45 degree phase, a third clock has an about 90 degree phase, a fourth clock has an about 135 degree phase, a fifth clock has an about 180 degree phase, a six clock has an about 225 degree phase, a seventh clock has an about 270 degree phase, and an eighth clock has an about 315 degree phase, where the phase control signal is generated based on phase differences of the first and second clocks, the second and third clocks, the third and fourth clocks, the fourth and fifth clocks, the fifth and sixth clocks, the sixth and seventh clocks, the seventh and eighth clocks, and the eighth and first clocks. The method, where the ILRO circuit includes a plurality of delay components, and where the phase differences of the first and second clocks, the third and fourth clocks, the fifth and sixth clocks, and the seventh and eighth clocks cause the phase control signal to increase a delay of the delay components. The method, where the ILRO circuit includes a plurality of delay components, and where the phase differences of the second and third clocks, the fourth and fifth clocks, the sixth and seventh clocks, and the eighth and first clocks cause the phase control signal to decrease a delay of the delay components. The method, where the ILRO circuit includes a plurality of delay components, and where changes in the phase differences of the first and second clocks, the third and fourth clocks, the fifth and sixth clocks, and the seventh and eighth clocks change a current, where the change in the current causes the phase control signal to decrease a delay of the delay components.

While this invention has been described with reference to illustrative implementations, this description is not intended to be construed in a limiting sense. Various modifications and combinations of the illustrative implementations, as well as other implementations of the invention, will be apparent to persons skilled in the art upon reference to the description. It is therefore intended that the appended claims encompass any such modifications or implementations.

What is claimed is:

1. An injection locked ring oscillator (ILRO) system, comprising:
    an ILRO circuit configured to receive a plurality of injection control signals and a phase control signal, and to generate a plurality of output clock signals;
    a phase detector circuit configured to receive the output clock signals and to generate a phase output signal based on phase differences of particular pairs of the output clock signals, wherein each of the particular pairs consists of output clock signals having adjacent phases, wherein the phase detector circuit is configured such that:
        phase differences between alternating pairs of the adjacent-phase output clock signals cause the phase control signal to adjust a delay in a first direction, and
        phase differences between the remaining pairs of the adjacent-phase output clock signals cause the phase control signal to adjust the delay in a second direction opposite to the first direction; and
    a phase to voltage circuit configured to receive the phase output signal from the phase detector circuit, and to generate the phase control signal based on the phase output signal, wherein the phase control signal presents a negative feedback phase signal to the ILRO circuit for the phase differences in the particular pairs of the output clock signals.

2. The ILRO system of claim 1, wherein the phase control signal presents the negative feedback phase signal to the ILRO circuit both for phase differences greater than 45 degrees in the particular pairs of the output clock signals and for phase differences less than 45 degrees in the particular pairs of the output clock signals.

3. The ILRO system of claim 1, wherein the output clock signals comprise eight output clock signals, wherein a first clock has an about 0 degree phase, a second clock has an about 45 degree phase, a third clock has an about 90 degree phase, a fourth clock has an about 135 degree phase, a fifth clock has an about 180 degree phase, a sixth clock has an about 225 degree phase, a seventh clock has an about 270 degree phase, and an eighth clock has an about 315 degree phase, wherein the phase control signal is generated based on phase differences of the first and second clocks, the second and third clocks, the third and fourth clocks, the fourth and fifth clocks, the fifth and sixth clocks, the sixth and seventh clocks, the seventh and eighth clocks, and the eighth and first clocks.

4. The ILRO system of claim 3, wherein the ILRO circuit comprises a plurality of delay components, and wherein the phase differences of the first and second clocks, the third and fourth clocks, the fifth and sixth clocks, and the seventh and eighth clocks cause the phase control signal to increase a delay of the delay components.

5. The ILRO system of claim 3, wherein the ILRO circuit comprises a plurality of delay components, and wherein the phase differences of the second and third clocks, the fourth and fifth clocks, the sixth and seventh clocks, and the eighth and first clocks cause the phase control signal to decrease a delay of the delay components.

6. The ILRO system of claim 3, wherein the ILRO circuit comprises a plurality of delay components, and wherein changes in the phase differences of the first and second clocks, the third and fourth clocks, the fifth and sixth clocks, and the seventh and eighth clocks change a current, wherein the change in the current causes the phase control signal to decrease a delay of the delay components.

7. The ILRO system of claim 3, wherein the ILRO circuit comprises a plurality of delay components, and wherein changes in the phase differences of the second and third clocks, the fourth and fifth clocks, the sixth and seventh clocks, and the eighth and first clocks change a current, wherein the change in the current causes the phase control signal to increase a delay of the delay components.

8. An injection locked phase rotator (ILPR) circuit, comprising:
    an ILPR decoder circuit configured to generate a plurality of injection control signals;

an injection locked ring oscillator (ILRO) circuit configured to receive the injection control signals and a phase control signal, and configured to generate a plurality of output clock signals;

a phase detector circuit configured to receive the output clock signals and to generate a phase output signal based on phase differences of particular pairs of the output clock signals separated by 45 degrees or less, wherein the particular pairs consist of phase-adjacent output clock signals, wherein the phase detector circuit maintains a constant polarity of the phase output signal while the injection control signals from the ILPR decoder circuit rotate through different phase positions; and a phase to voltage circuit configured to receive the phase output signal, and to generate the phase control signal based on the phase output signal.

9. The ILPR circuit of claim 8, wherein the phase control signal presents a negative feedback phase signal to the ILRO circuit both for phase differences greater than 45 degrees in the particular pairs of the output clock signals and for phase differences less than 45 degrees in the particular pairs of the output clock signals.

10. The ILPR circuit of claim 8, wherein the output clock signals comprise eight output clock signals, wherein a first clock has an about 0 degree phase, a second clock has an about 45 degree phase, a third clock has an about 90 degree phase, a fourth clock has an about 135 degree phase, a fifth clock has an about 180 degree phase, a sixth clock has an about 225 degree phase, a seventh clock has an about 270 degree phase, and an eighth clock has an about 315 degree phase, wherein the phase control signal is generated based on phase differences of the first and second clocks, the second and third clocks, the third and fourth clocks, the fourth and fifth clocks, the fifth and sixth clocks, the sixth and seventh clocks, the seventh and eighth clocks, and the eighth and first clocks.

11. The ILPR circuit of claim 10, wherein the ILRO circuit comprises a plurality of delay components, and wherein the phase differences of the first and second clocks, the third and fourth clocks, the fifth and sixth clocks, and the seventh and eighth clocks cause the phase control signal to increase a delay of the delay components.

12. The ILPR circuit of claim 10, wherein the ILRO circuit comprises a plurality of delay components, and wherein the phase differences of the second and third clocks, the fourth and fifth clocks, the sixth and seventh clocks, and the eighth and first clocks cause the phase control signal to decrease a delay of the delay components.

13. The ILPR circuit of claim 10, wherein the ILRO circuit comprises a plurality of delay components, and wherein changes in the phase differences of the first and second clocks, the third and fourth clocks, the fifth and sixth clocks, and the seventh and eighth clocks change a current, wherein the change in the current causes the phase control signal to decrease a delay of the delay components.

14. The ILPR circuit of claim 10, wherein the ILRO circuit comprises a plurality of delay components, and wherein changes in the phase differences of the second and third clocks, the fourth and fifth clocks, the sixth and seventh clocks, and the eighth and first clocks change a current, wherein the change in the current causes the phase control signal to increase a delay of the delay components.

15. A method of operating an injection locked phase rotator (ILPR) circuit, the method comprising:

with an ILPR decoder circuit, generating a plurality of injection control signals;

with an injection locked ring oscillator (ILRO) circuit, receiving the injection control signals from the ILPR decoder circuit;

with the ILRO circuit, receiving injection clocks;

with the ILRO circuit, receiving a phase control signal;

with the ILRO circuit, generating a plurality of output clock signals based on the injection control signals, the injection clocks, and the phase control signal;

with a phase detector circuit, receiving the output clock signals;

with the phase detector circuit, generating a phase output signal based on phase differences of particular pairs of the output clock signals, wherein the particular pairs of the output clock signals are separated by 45 degrees or less, and wherein the particular pairs consist of phase-adjacent output clock signals, wherein generating the phase output signal comprises:
    causing the phase control signal to adjust delay in a first direction based on phase differences between alternating pairs of the adjacent-phase output clock signals; and
    causing the phase control signal to adjust delay in a second direction opposite to the first direction based on phase differences between the remaining pairs of the adjacent-phase output clock signals;

with a phase to voltage circuit, receiving the phase output signal from the phase detector circuit; and with the phase to voltage circuit, generating the phase control signal based on the phase output signal.

16. The method of claim 15, wherein the phase control signal presents a negative feedback phase signal to the ILRO circuit both for phase differences greater than 45 degrees in the particular pairs of the output clock signals and for phase differences less than 45 degrees in the particular pairs of the output clock signals.

17. The method of claim 15, wherein the output clock signals comprise eight output clock signals, wherein a first clock has an about 0 degree phase, a second clock has an about 45 degree phase, a third clock has an about 90 degree phase, a fourth clock has an about 135 degree phase, a fifth clock has an about 180 degree phase, a sixth clock has an about 225 degree phase, a seventh clock has an about 270 degree phase, and an eighth clock has an about 315 degree phase, wherein the phase control signal is generated based on phase differences of the first and second clocks, the second and third clocks, the third and fourth clocks, the fourth and fifth clocks, the fifth and sixth clocks, the sixth and seventh clocks, the seventh and eighth clocks, and the eighth and first clocks.

18. The method of claim 17, wherein the ILRO circuit comprises a plurality of delay components, and wherein the phase differences of the first and second clocks, the third and fourth clocks, the fifth and sixth clocks, and the seventh and eighth clocks cause the phase control signal to increase a delay of the delay components.

19. The method of claim 17, wherein the ILRO circuit comprises a plurality of delay components, and wherein the phase differences of the second and third clocks, the fourth and fifth clocks, the sixth and seventh clocks, and the eighth and first clocks cause the phase control signal to decrease a delay of the delay components.

20. The method of claim 17, wherein the ILRO circuit comprises a plurality of delay components, and wherein changes in the phase differences of the first and second clocks, the third and fourth clocks, the fifth and sixth clocks, and the seventh and eighth clocks change a current, wherein the change in the current causes the phase control signal to decrease a delay of the delay components.

\* \* \* \* \*